United States Patent [19]
Matsumoto

[11] Patent Number: 5,396,084
[45] Date of Patent: Mar. 7, 1995

[54] THIN FILM TRANSISTOR DEVICE HAVING DRIVING CIRCUIT AND MATRIX CIRCUIT

[75] Inventor: Hiroshi Matsumoto, Hachioji, Japan

[73] Assignee: Casio Computer Co., Ltd., Tokyo, Japan

[21] Appl. No.: 70,724

[22] Filed: Jun. 2, 1993

[30] Foreign Application Priority Data

Jun. 3, 1992 [JP] Japan .................................. 4-166673

[51] Int. Cl.$^6$ .................... H01L 29/04; H01L 27/01; H01L 27/12; H01L 29/76
[52] U.S. Cl. ........................ 257/72; 257/59; 257/350; 257/351; 257/411
[58] Field of Search ............... 257/57, 59, 66, 72, 257/347, 350, 351, 411, 202

[56] References Cited

U.S. PATENT DOCUMENTS

| | | | |
|---|---|---|---|
| 3,840,695 | 10/1974 | Fischer | 257/59 |
| 4,395,726 | 7/1983 | Maeguchi | 257/347 |
| 5,060,034 | 10/1991 | Shimizu et al. | 257/350 |

FOREIGN PATENT DOCUMENTS

| | | | |
|---|---|---|---|
| 1-185522 | 7/1989 | Japan | 257/59 |
| 2-27320 | 1/1990 | Japan | 257/57 |

Primary Examiner—Rolf Hille
Assistant Examiner—Steven Loke
Attorney, Agent, or Firm—Frishauf, Holtz, Goodman & Woodward

[57] ABSTRACT

A thin film semiconductor device comprises a matrix circuit portion and a peripheral circuit portion. An NMOS thin film transistor included in the peripheral circuit portion comprises as an active layer a polysilicon thin film formed on a substrate, leading to a high on-current and an improved switching speed, compared with a thin film transistor including as an active layer of a polysilicon thin film which is obtained by crystallizing an amorphous silicon thin film. An NMOS thin film transistor included in the matrix circuit portion also comprises as an active layer a polysilicon thin film which is formed on the substrate. However, the gate insulating film of an NMOS thin film transistor in the matrix circuit portion as a whole is made thicker than that in the NMOS thin film transistor included in the peripheral circuit portion because of the presence of a first interlayer insulating film.

7 Claims, 4 Drawing Sheets

THIN FILM TRANSISTOR DEVICE HAVING DRIVING CIRCUIT AND MATRIX CIRCUIT

BACKGROUND OF THE INVENTION

1. Field of the Invention

The present invention relates to a thin film transistor device having a matrix circuit for applying an electric field to a liquid crystal display device and a driving circuit for driving the matrix circuit.

2. Description of the Related Art

An active matrix type liquid crystal display is known to the art. The conventional active matrix type liquid crystal display comprises a matrix circuit for applying an electric field to a liquid crystal display device and a peripheral driving circuit for driving the matrix circuit, each circuit being formed of field effect type thin film transistors.

FIG. 5 shows one example of the circuit structure of such a conventional active matrix type liquid crystal display.

This active matrix type liquid crystal display comprises a matrix circuit 51, one peripheral driving circuit 52 for supplying a scanning signal to an address bus of the matrix circuit 51, and another peripheral driving circuit 53 for supplying a display signal to a data bus of the matrix circuit 51. In the matrix circuit 51, there are formed a large number of scanning electrodes arranged in row and a large number of display electrodes 55 arranged in column, and a thin film transistor 57 for the matrix circuit 51 is formed for each pixel 56 (liquid crystal) corresponding to each cross point of the scanning electrodes 54 and the display electrodes 55. A gate electrode of each thin film transistor 57 is connected to each scanning electrode 54, and a source electrode is connected to the display electrode 55. A drain electrode of each thin film transistor 57 is connected to a pixel capacitive element 58 having a transparent electrode connected to each pixel in parallel. One peripheral circuit 52 comprises a thin film transistor (not shown) for said one peripheral circuit, which is connected to one end of the scanning electrode 54. The other peripheral circuit 53 comprises a thin film transistor for said other peripheral circuit, which is connected to one end of the scanning electrode 55. Then, if the thin film transistor 57 for the matrix circuit is turned on, the display data is written in the capacitive element 58 in the form of an electric charge. If the thin film transistor 57 for the matrix circuit is turned off, the pixel 56 is driven in a predetermined time by the written electric charge.

According to such a conventional thin film transistor device, the thin film transistor 57 forming the matrix circuit 51 and the thin film transistor forming the peripheral driving circuit were formed in the same structure. Therefore, characteristics of the transistor such as a switching speed of the thin film transistor, a cut-off speed and the like were the same in both transistors.

In recent years, display with extremely high precision has been required in the active matrix type liquid crystal display, and it has been needed that the number of thin film transistors, which form the matrix circuit 51 and the peripheral driving circuits 52 and 53, is increased.

However, as the number of thin film transistors is increased, the current consumption in the entire device is increased. In order to solve this problem, the cut-off current of each thin film transistor 57 must be controlled to be small. On the other hand, the switching speed of each thin film transistor must be increased in accordance with increase in the number of thin film transistors. However, as is well-known, the on-current must be increased in order to increase the switching speed, and the cut-off current is also increased by the increase in the on-current. For this reason, the above two requirements cannot be satisfied simultaneously.

SUMMARY OF THE INVENTION

An object of the present invention is to provide a thin film transistor device wherein the number of thin film transistors, which form a matrix circuit and peripheral driving circuits, can be considerably increased, an on-current can be increased, and a cut-off current can be reduced.

According to the present invention, there is provided a thin film semiconductor device, comprising:
 a substrate having a first region and a second region;
 a first thin film transistor formed on said first region of said substrate and including a semiconductor thin film, a gate insulating film, a gate electrode, a source electrode and a drain electrode; and
 a second thin film transistor formed on said second region of said substrate and including a semiconductor thin film, a gate insulating film thicker than the gate insulating film included in said first thin film transistor, a gate electrode, a source electrode and a drain electrode.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENT

Figure 1:
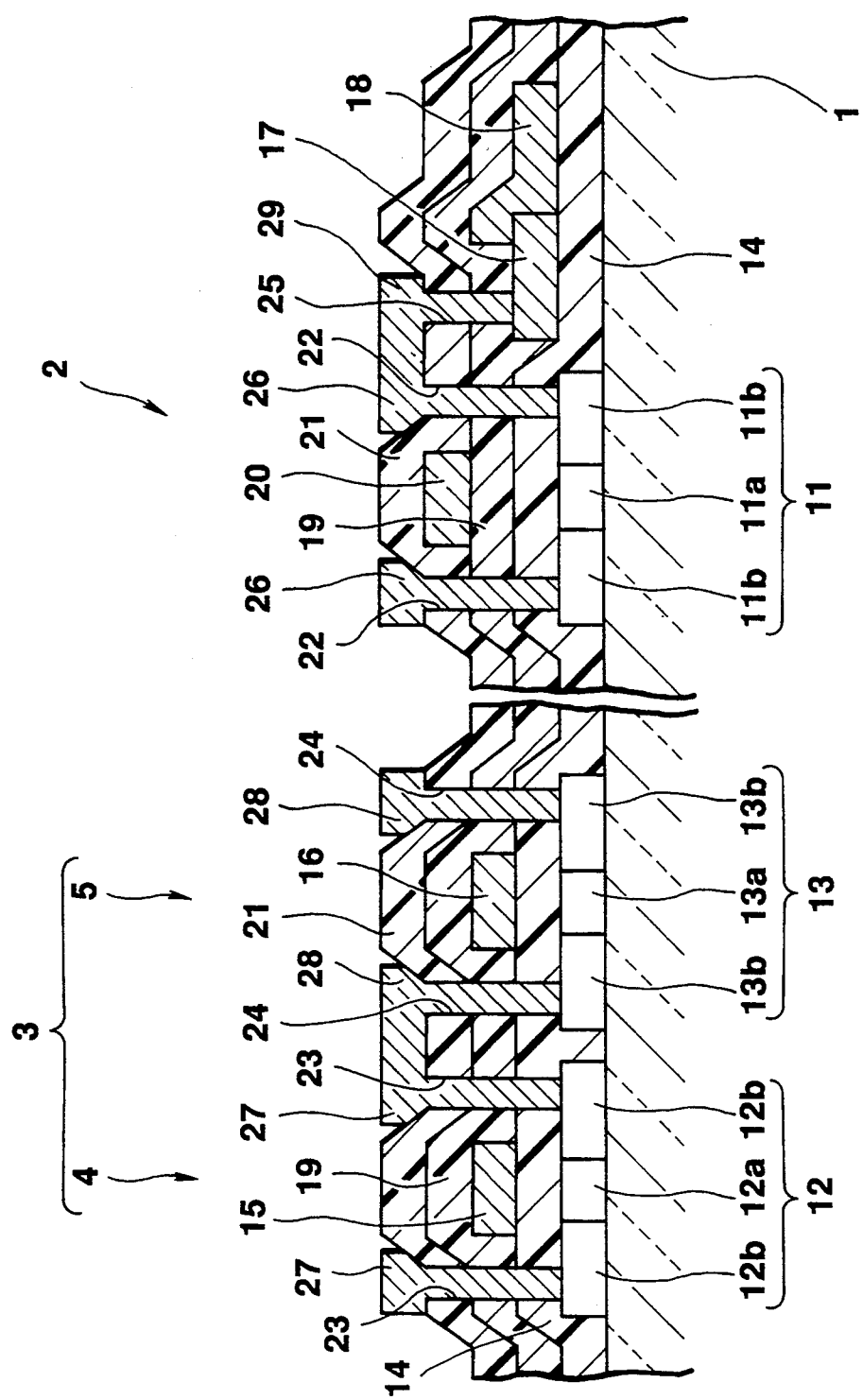
FIG. 1 is a cross sectional view showing a thin film semiconductor device according to one embodiment of the present invention.

FIG. 1 shows a gist portion of a thin film semiconductor device according to one embodiment of the present invention. In the thin film semiconductor device shown in the drawing, an NMOS thin film transistor 2 for a matrix circuit and a CMOS thin film transistor 3 for a peripheral circuit are formed at predetermined positions on the upper surface of an insulating substrate 1 made of a transparent material such as glass. An NMOS thin film transistor 4 for a peripheral circuit and an NMOS thin film transistor 2 for a matrix circuit are sometimes referred to herein as the first and second transistors, respectively. The predetermined positions on insulating substrate 1 at which the first and second transistors are located are sometimes referred to herein as the first and second regions, respectively.

The CMOS thin film transistor 3 for a peripheral circuit comprises an NMOS thin film transistor 4 and a PMOS thin film transistor 5.

The thin film transistors 2, 4 and 5 comprise polysilicon thin films 11, 12, 13, respectively, each having a pattern formed at a predetermined position on the upper surface of the insulating substrate 1. These polysilicon thin films 11, 12, 13 comprise central portions 11a, 12a, 13a acting as channel regions, and source-drain regions 11b, 12b, 13b of a high impurity concentration, respectively. As shown in the drawing, these channel regions 11a, 12a, 13a are interposed between the source-drain regions 11b, 12b, 13b, respectively. A gate insulating film 14 is formed on the entire surface of the insulating substrate 1 to cover the upper surfaces of the polysilicon thin films 11, 12, 13 and to cover directly the surface of the insulating substrate 1 in the regions where the polysilicon thin films are not positioned. Gate electrodes 15 and 16 are formed on the upper surface of the gate insulating film 14 in the regions corresponding to the channel regions 12a and 13a of the polysilicon thin films 12 and 13, respectively, said thin films 12 and 13 being mounted on the insulating substrate 1 in the peripheral circuit portion.

An intermediate electrode 17 and a pixel electrode 18 consisting of ITO are formed at predetermined positions on the upper surface of the gate insulating film 14 mounted on the insulating substrate 1 in the matrix circuit portion. A first interlayer insulating film 19 is formed on the entire surface including the upper surfaces of the gate insulating film 14, the gate electrodes 15, 16, the intermediate electrode 17 and the pixel electrode 18. A gate electrode 20 is formed on the upper surface of the first interlayer insulating film 19 in the portion corresponding to the channel region 11a of the polysilicon thin film 11. It should be noted that the first interlayer insulating film 19 also acts as a gate insulating film in the matrix circuit portion. It follows that the gate insulating film in the matrix circuit portion includes an upper layer which is the first interlayer insulating film 19, and a lower layer which is gate insulating film 14. Thus, the combined gate insulating film is thicker than that in the peripheral circuit portion. A second interlayer insulating film 21 is formed on the entire surface including the upper surfaces of the first interlayer insulating film and the gate electrode 20. Contact holes 22 to 25 are formed in the second interlayer insulating film 21, the first interlayer insulating film 19 and the gate insulating film 14 in the regions corresponding to the source-drain regions 11b, 12b, 13b, and the intermediate electrode 17. Of course, source-drain electrodes 26 to 28 and the intermediate electrode 29 are formed in these contact holes 22 to 25. One of the source-drain electrodes 26 of the thin film transistor for the matrix circuit is connected to the pixel electrode 18 via the intermediate electrodes 29 and 17. On the other hand, one of the source-drain electrodes 27 of the NMOS thin film transistor 4 included in the CMOS thin film transistor 3 for the peripheral circuit is connected to one of the source-drain electrodes 28 of the PMOS thin film transistor 5 included in the CMOS thin film transistor 3.

Figure 2A:
FIGS. 2A to 2E are cross sectional views collectively showing how to manufacture the thin film semiconductor device shown in FIG. 1.

FIGS. 2A to 2E collectively show how to manufacture the thin film semiconductor device shown in FIG. 1. In the first step, a polysilicon thin film 31 is formed on the entire upper surface of an insulating substrate 1, as shown in FIG. 2A. The polysilicon film 31 is directly deposited on the upper surface of the insulating substrate 1 by a plasma CVD method using a mixed gas consisting of disilane $Si_2H_6$ and a hydrogen gas $H_2$. The plasma CVD treatment is carried out under a gaseous pressure of about 0.1 to 1 Torr with the substrate set at such a low temperature as about 300° to 400° C. In this step, the flow rate ratio of the disilane gas to the hydrogen gas is set at 10% or less.

Figure 2B:
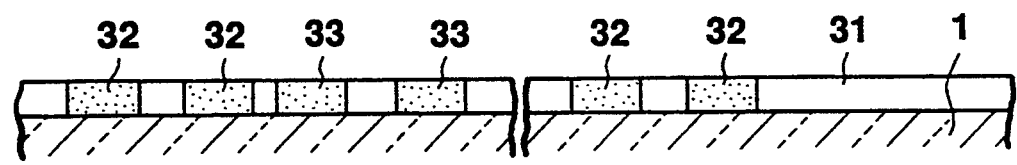

In the next step, an n-type impurity is selectively introduced into the polysilicon film 31 using an ion implantation apparatus to form n-type impurity regions 32, as shown in FIG. 2B. A photoresist film of a predetermined pattern (not shown) is used as a mask in the step of introducing the n-type impurity. Then, a p-type impurity is selectively introduced into the polysilicon film 31 using an ion implantation apparatus to form p-type impurity regions 33. A photoresist film of another pattern (not shown) is used as a mask in the step of introducing the p-type impurity. As a result, n-type impurity regions 32 and p-type impurity regions 33 are formed at predetermined portions of the polysilicon thin film 31. After the ion implantation step, the thin polysilicon film is annealed so as to activate the n-type and p-type impurities introduced therein.

Figure 2C:
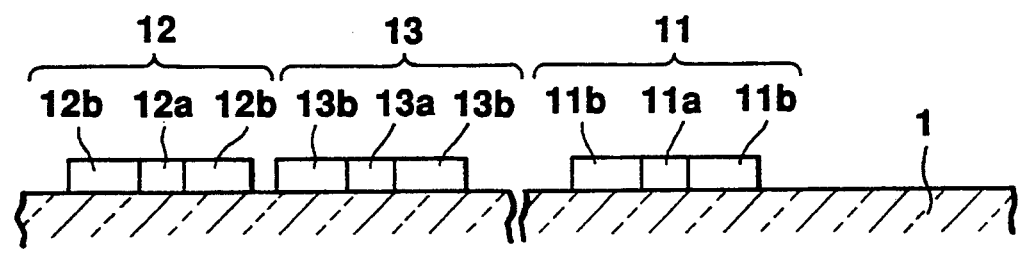
Figure 2D:
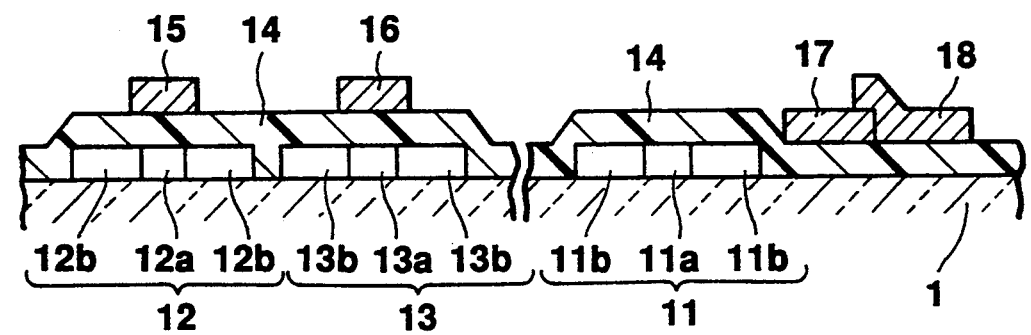

After the annealing step, the undesired portion of the polysilicon thin film 31 is removed by etching using a photolithography technique so as to form polysilicon thin films 11, 12, 13 at predetermined positions on the upper surface of the insulating substrate 1, as shown in FIG. 2C. At this stage, the central portions of the polysilicon thin films 11, 12, 13 constitute the channel regions 11a, 12a, 13a, and the end portions of these polysilicon thin films 11, 12, 13 constitute the source-drains regions 11b, 12b, 13b of a high impurity concentration, respectively, because the n-type and p-type impurities introduced into the polysilicon thin film 31 are activated in advance in the step shown in FIG. 2B.

After the selective etching step, a gate insulating film 14 consisting of silicon oxide or silicon nitride is formed by a sputtering technique or a plasma CVD technique. Then, gate electrodes 15 and 16 each made of aluminum, chromium or the like are formed by using a sputtering apparatus on the upper surface of the gate insulating film 14 in the portions corresponding to the channel regions 12a and 13a of the polysilicon thin films 12 and 13, respectively, in the peripheral circuit portion. At the same time, the intermediate electrode 17 is formed in a predetermined position on the upper surface of the gate insulating film 14 in the matrix circuit portion. Further, the pixel electrode 18 made of ITO is formed by using a sputtering apparatus. The pixel electrode 18 is formed in direct contact with the intermediate electrode 17 and in a predetermined position on the upper surface of the gate insulating film 14 in the vicinity of the intermediate electrode 17.

Figure 2E:
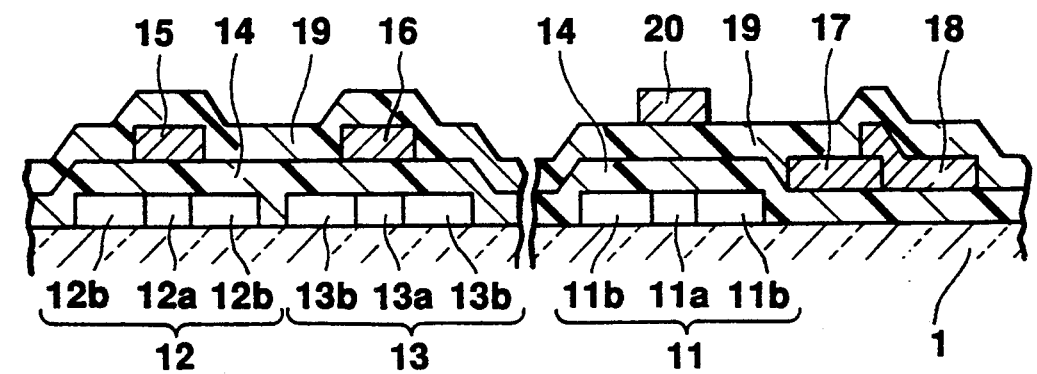

In the next step, the first interlayer insulating film 19, which is made of silicon oxide or silicon nitride, is formed on the entire surface by a sputtering technique or a plasma CVD method, as shown in FIG. 2E. Then, a gate electrode 20, which is made of aluminum, chromium or the like, is formed by using a sputtering apparatus on the upper surface of the first interlayer insulating film 19. The gate electrode 20 is formed in a position corresponding to the channel region 11a of the polysilicon thin film 11 in the matrix circuit portion. After formation of the gate electrode 20, a second interlayer insulating film 21, which is made of silicon oxide or silicon nitride, is formed on the entire surface by a sputtering technique or a plasma CVD method.

Further, the contact holes 22 to 25 are formed in the second interlayer insulating film 21, the first interlayer insulating film 19 and the gate insulating film 14, as shown in FIG. 1. These contact holes are positioned %o correspond to the source-drain regions 11b, 12b, 13b, and the intermediate electrode 17. Finally, the source-drain electrodes 26 to 28 and the intermediate electrode 29 are formed in these contact holes 22 to 25 by using a sputtering apparatus, so as to manufacture the thin film semiconductor device shown in FIG. 1.

In the matrix circuit portion of the thin film semi-conductor device shown in FIG. 1, the first interlayer insulating film 19 also acts as a gate insulating film. As a result, the gate insulating film in the matrix circuit portion, which includes the first interlayer insulating film 19, is thicker than the gate insulating film in the peripheral circuit portion.

Figure 3:
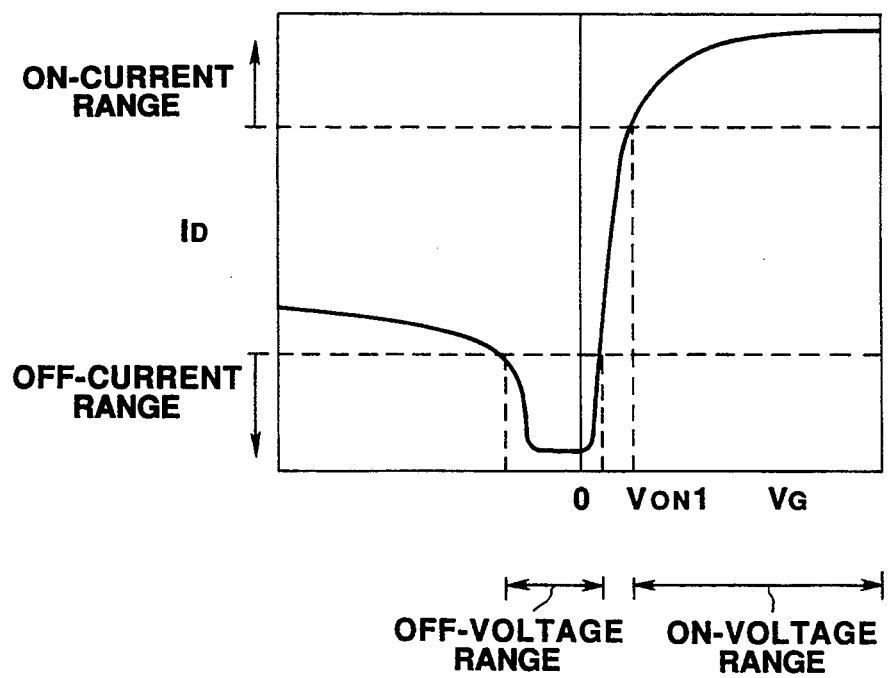
FIG. 3 is a graph showing the gate voltage-drain current (VG-ID) characteristics of NMOS thin film transistors forming a peripheral circuit portion included in the thin film semiconductor device shown in FIG. 1.
Figure 4:
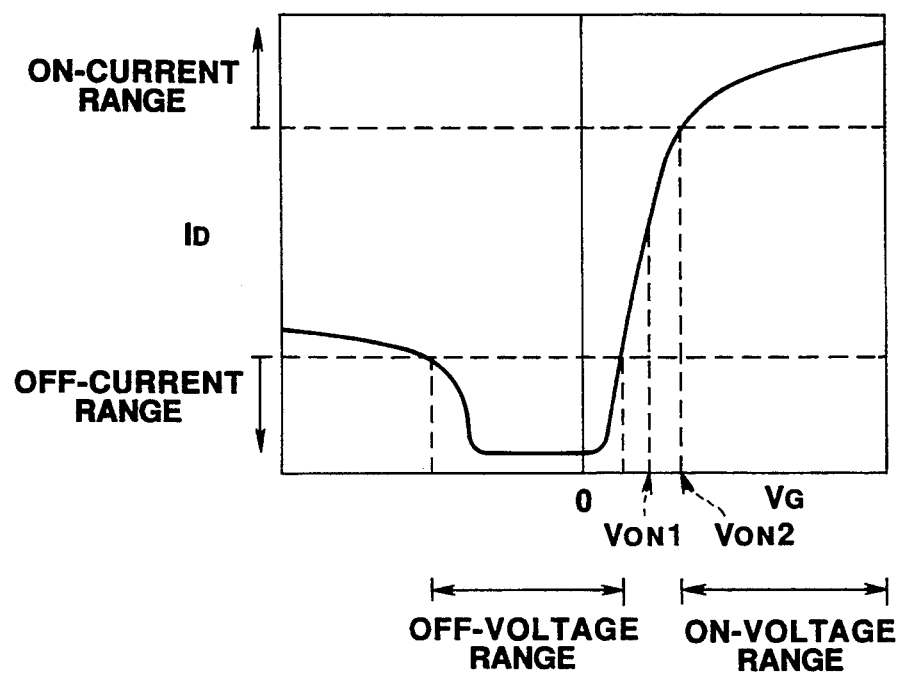
FIG. 4 is a graph showing the gate voltage-drain current (VG-ID) characteristics of NMOS thin film transistors forming a matrix circuit portion included in the thin film semiconductor device shown in FIG. 1.
Figure 5:
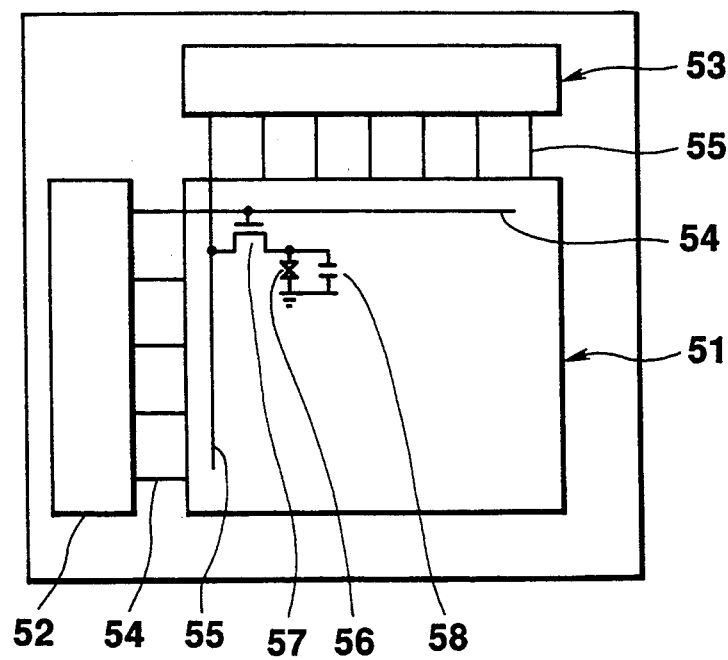
FIG. 5 is a plan view showing a conventional active matrix type liquid crystal display device.

FIG. 3 shows the gate voltage-drain current characteristics (VG-ID characteristics) of the NMOS thin film transistor 4 in the peripheral circuit portion. Further, FIG. 4 shows the VG-ID characteristics of the NMOS thin film transistor 2 in the matrix circuit portion. As seen from FIG. 3, in the NMOS thin film transistor 4 in the peripheral circuit portion, an on-current (about 1 μA) is reached with a low gate voltage VG, i.e., voltage $V_{ON1}$ of about 20 V. However, the range of the gate voltage which permits maintaining an off-current (about 1 pA) is very narrow. On the other hand, when i% comes to the NMOS thin film transistor 2 in the matrix circuit portion, the gate voltage VG which permits the drain current ID to reach an on-current is the voltage $V_{ON2}$, which is about 30 V, as shown in FIG. 4. In short, the voltage $V_{ON2}$ for the NMOS thin film transistor 2 is higher than the voltage $V_{ON1}$ for the NMOS thin film transistor 4 in the peripheral circuit portion. However, the range of the gate voltage which permits maintaining an off-current in the NMOS thin film transistor 2 in the matrix circuit portion 2 is much broader than that in the NMOS transistor 4 in the peripheral circuit portion. This implies that the NMOS thin film transistor 2 makes it possible to markedly suppress the increase in the current consumption, which is caused by the nonuniformity in the manufacturing step, compared with the NMOS thin film transistor 4 in the peripheral circuit portion.

In the graph of each of FIGS. 3 and 4, the on-current is on the basis of the drain current ID required for the driving circuit of a liquid crystal display device including a shift register, etc. The same on-current value (about 1 μA) is used for the comparison between the NMOS thin film transistors 2 and 4. However, an NMOS transistor with a lower on-current can be used for the switching of the pixel electrode 18 for a liquid crystal display device. Even if the gate voltage VG applied to the NMOS thin film transistor 2 is equal to the threshold voltage $V_{ON1}$ of the NMOS thin film transistor 4 as shown in FIG. 4, the pixel electrode 18 can be sufficiently charged in the case of using a polysilicon thin film.

As described above in detail, the NMOS thin film transistor 4 in the peripheral circuit portion can be driven by a low voltage with a sufficiently high operating speed in the thin film semiconductor device of the present invention. In this case, the operating speed of the NMOS thin film transistor 2 in the matrix portion is sufficiently high for the switching purpose for charging the pixel electrode 18. Further, the off-current of the NMOS thin film transistor 2 in the matrix portion can be lowered during non-operation so as to markedly save the power consumption of the entire thin film semiconductor device.

Various modifications can be achieved within the technical scope of the present invention. For example, a PMOS thin film transistor can also be used in place of the NMOS thin film transistor for forming the matrix circuit portion. Also, NMOS thin film transistors alone or PMOS thin film transistors alone can be used for forming the peripheral circuit portion. Further, the thin film semiconductor device of the present invention can also be used in the driving circuit for a thin film transistor memory or for an image sensor as well as in the driving circuit for an active matrix liquid crystal display device.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A thin film semiconductor device, comprising:
a substrate having a first region and a second region;
a first non-memory thin film transistor formed on said first region of said substrate and including,
   a polysilicon semiconductor thin film,
   a gate insulating film, and
   a gate electrode, a source electrode and a drain electrode; and
a second non-memory thin film transistor formed on said second region of said substrate and being controllably driven by said first thin film transistor, said second non-memory thin film transistor including,
   a polysilicon semiconductor thin film, and
   a gate insulating film, a gate electrode, a source electrode and a drain electrode, said gate insulating film of said second thin film transistor being thicker than that of said first thin film transistor;
whereby a gate voltage to reach on-current in said first thin film transistor is lower than that in said second thin film transistor, and a gate voltage range to keep an off-current range in said second thin film transistor is broader than that in said first thin film transistor.

2. The thin film semiconductor device according to claim 1, which further comprises a pixel electrode connected to said source electrode or drain electrode of said second thin film transistor.

3. The thin film semiconductor device according to claim 1, wherein said gate insulating film of said second thin film transistor is of a laminate structure consisting of an upper layer and a lower layer.

4. The thin film semiconductor device according to claim 3, wherein said upper layers of said gate insulating film included in said second thin film transistor covers said gate electrode of said first thin film transistor.

5. A thin film semiconductor device, comprising:
   a substrate having a first region and a second region;
   a peripheral circuit portion formed on said substrate having a plurality of first non-memory thin film transistors, each of said first thin film transistors including,
   a polysilicon semiconductor thin film,
   a gate insulating film, and
   a gate electrode, a source electrode and a drain electrode; and
   a matrix circuit portion formed in the vicinity of said peripheral circuit portion by arranging on said substrate a plurality of second non-memory thin film transistors to form a matrix, each of said second thin film transistors including,
   a polysilicon semiconductor thin film,
   a gate insulating film, and
   a gate electrode, a source electrode and a drain electrode, said gate insulating film included in each of said second thin film transistors being thicker than that included in each of said first thin film transistors, said peripheral circuit portion serving to drive each of said second thin film transistors included in said matrix circuit portion;
   whereby a gate voltage to reach on-current in each of said first thin film transistors is lower than that in each of said second thin film transistors, and a gate voltage range to keep an off-current range in each of said second thin film transistors is broader than that in each of said first thin film transistors.

6. The thin film semiconductor device according to claim 5, wherein said substrate is transparent.

7. The thin film semiconductor device according to claim 6, which further comprises a pixel electrode connected to said source or drain electrode of said second thin film transistor and an intermediate electrode.

* * * * *